(12) United States Patent
Ohba

(10) Patent No.: US 7,629,642 B2
(45) Date of Patent: Dec. 8, 2009

(54) SEMICONDUCTOR DEVICE

(75) Inventor: Ryuji Ohba, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 577 days.

(21) Appl. No.: 11/296,314

(22) Filed: Dec. 8, 2005

(65) Prior Publication Data

US 2006/0124991 A1  Jun. 15, 2006

(30) Foreign Application Priority Data

Dec. 10, 2004  (JP) ............................. 2004-358981
Nov. 30, 2005  (JP) ............................. 2005-345466

(51) Int. Cl.
*H01L 29/788* (2006.01)
(52) U.S. Cl. ................. 257/324; 257/E29.309
(58) Field of Classification Search ................. 257/314, 257/315, 316, 324, E29.309, E21.209
See application file for complete search history.

(56) References Cited

U.S. PATENT DOCUMENTS 6,680,505 B2   1/2004  Ohba et al.

2002/0140023 A1*  10/2002  Ohba et al. ................. 257/315

FOREIGN PATENT DOCUMENTS

JP  2002-289710  10/2002

* cited by examiner

*Primary Examiner*—Thomas L Dickey
*Assistant Examiner*—Fazli Erdem
(74) *Attorney, Agent, or Firm*—Oblon, Spivak, McClelland, Maier & Neustadt, L.L.P.

(57) ABSTRACT

A semiconductor device includes a semiconductor region having a source region, a drain region, and a channel region provided between the source region and the drain region, a first tunnel insulation film formed on the channel region, a barrier layer formed on the first tunnel insulation film and having an energy barrier, a second tunnel insulation film formed on the barrier layer, a charge storage portion formed on the second tunnel insulation film and comprising an insulation film expressed by $Si_Y(SiO_2)_X(Si_3N_4)_{1-X}M_Z$ (where, M denotes an element other than Si, O, and N, and $0 \leq X \leq 1$, $Y > 0$, and $Z \geq 0$), and a control electrode formed on the charge storage portion and controlling a height of the energy barrier.

22 Claims, 5 Drawing Sheets

SEMICONDUCTOR DEVICE

CROSS-REFERENCE TO RELATED APPLICATIONS

This application is based upon and claims the benefit of priority from prior Japanese Patent Applications No. 2004-358981, filed Dec. 10, 2004; and No. 2005-345466, filed Nov. 30, 2005, the entire contents of both of which are incorporated herein by reference.

BACKGROUND OF THE INVENTION

1. Field of the Invention

The present invention relates to a semiconductor device.

2. Description of the Related Art

As a nonvolatile semiconductor memory device, a floating gate type memory device with a conductive nano-particle layer provided between tunnel insulation films is proposed (see, for example, Jpn. Pat. Appln. KOKAI Publication No. 2002-289710). One example of a conventional floating gate type memory device will be described as follow.

A lower tunnel insulation film, a nano-particle layer, and an upper tunnel insulation film are successively formed on a silicon substrate having a source/drain region, and a charge storage portion which serves as a floating gate electrode is formed on the upper tunnel insulation film. Furthermore, a control insulation film and a control gate electrode are successively formed on the charge storage portion. The nano-particle layer is formed by conductive nano-particles which satisfy the Coulomb blockage condition (charging energy of one electron is greater than thermal fluctuation). For the charge storage portion, for example, a silicon nitride film ($Si_3N_4$ film) is used.

Information is written by injecting electrons into traps in the silicon nitride film (charge storage portion). That is, by applying the positive voltage to the control gate electrode, carrier electrons in the inversion layer formed in the silicon substrate surface are injected into traps in the silicon nitride film via the tunnel oxide films with the nano-particle layer held therebetween. Information is read by discriminating quantity of drain current that complies with presence or absence of trap charges. Trap charges are discharged by allowing the trap charges to tunnel to the silicon substrate via the tunnel oxide films with the nano-particle layer held therebetween by applying negative voltage to the control gate electrode.

However, in the conventional structure as described above, there has been a problem that percolation leakage between the source and drain generated by device size scaling cannot be successfully suppressed. Consequently, it has been difficult to obtain a semiconductor device which achieves excellent characteristics and reliability.

BRIEF SUMMARY OF THE INVENTION

A semiconductor device according to an aspect of the present invention comprises: a semiconductor region having a source region, a drain region, and a channel region provided between the source region and the drain region; a first tunnel insulation film formed on the channel region; a barrier layer formed on the first tunnel insulation film and having an energy barrier; a second tunnel insulation film formed on the barrier layer; a charge storage portion formed on the second tunnel insulation film and comprising an insulation film expressed by $Si_Y(SiO_2)_X(Si_3N_4)_{1-X}M_Z$ (where, M denotes an element other than Si, O, and N, and $0 \leq X \leq 1$, $Y>0$, and $Z \geq 0$); and a control electrode formed on the charge storage portion and controlling a height of the energy barrier.

DETAILED DESCRIPTION OF THE INVENTION

Referring now to drawings, embodiments of the present invention will be described in detail as follows.

First Embodiment

Figure 1A:
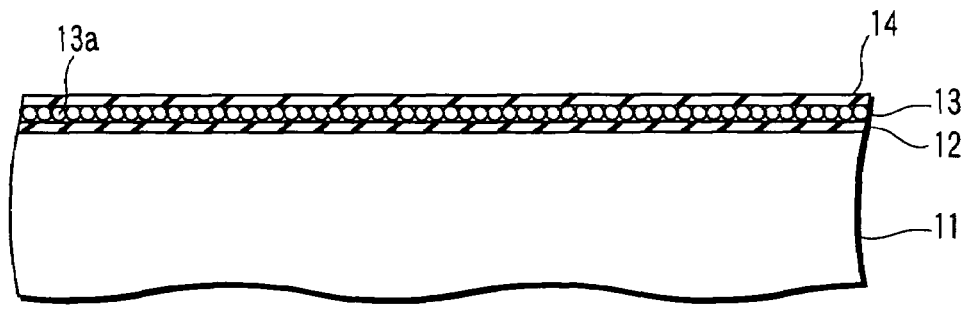
FIGS. 1A to 1C are cross-sectional views that schematically show a process of manufacturing a nonvolatile semiconductor memory device according to first to third embodiments of the present invention.
Figure 1B:
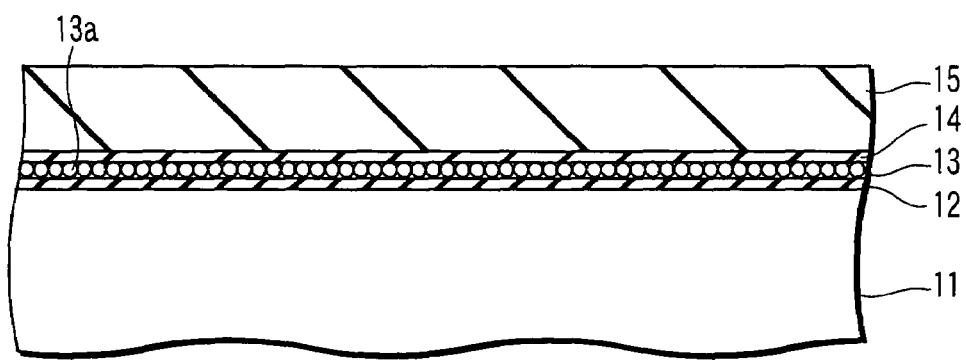
Figure 1C:
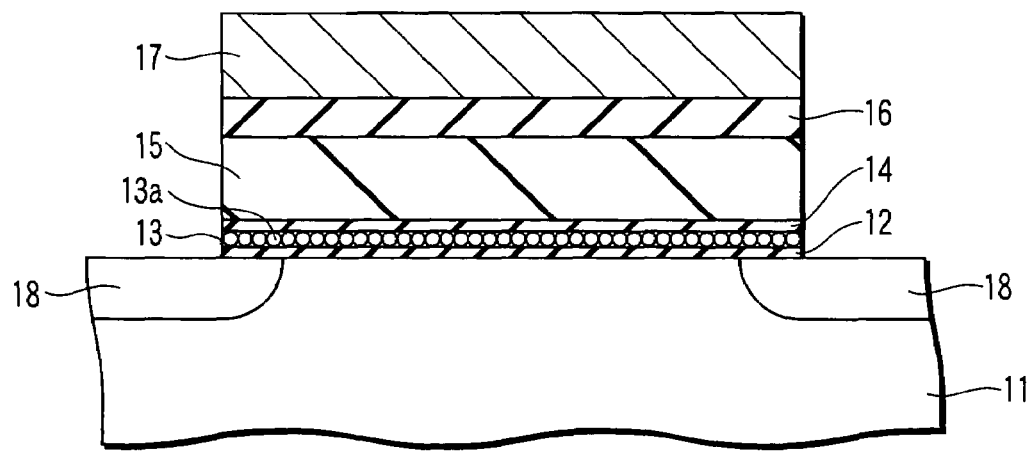

FIGS. 1A to 1C are cross-sectional views which schematically show a process of manufacturing a nonvolatile semiconductor memory device (floating gate type memory device) according to a first embodiment.

First of all, as shown in FIG. 1A, a 1-nm-thick thermal oxide film (silicon oxide film) 12 is formed on a silicon substrate (semiconductor substrate) 11 by a thermal oxidation process. Then, an amorphous silicon (a-Si) film of 2.5 nm thick is deposited on the thermal oxide film 12 by a CVD process. Furthermore, a 1-nm-thick thermal oxide film (silicon oxide film) 14 is formed on the a-Si film by the thermal oxidation process. By this thermal oxidation, the a-Si film thickness is reduced to 2 nm. Thereafter, 900° C. high-temperature annealing is carried out in the nitrogen atmosphere. As a result, the a-Si film is converted to a silicon layer 13 formed of nano-crystal silicon grains 13a about 2 nm in average grain size. Incidentally, the transverse size of the nano-crystal silicon grain can be controlled by the annealing time.

In this way, a nano-particle layer 13 that has conductive nano-particles (nano-crystal silicon grains) 13a which satisfy the Coulomb blockage condition (charging energy of one electron is larger than thermal fluctuation) is formed. As a result, a structure with a 2-nm-thick nano-particle layer 13 provided between the 1-nm-thick silicon oxide film (first tunnel insulation film) 12 and the 1-nm-thick silicon oxide film (second tunnel insulation film) 14 is obtained.

Next, as shown in FIG. 1B, a 20-nm-thick silicon-rich silicon nitride film 15 which serves as a charge storage portion (floating gate) is formed by an LPCVD method. The silicon nitride film 15 has a silicon composition ratio which is higher than the silicon composition ratio of a silicon nitride film that satisfies stoichiometry. That is, the silicon nitride film 15 has a higher composition ratio Si/N than the composition ratio Si/N (3/4=0.75) of the silicon nitride film $Si_3N_4$ that satisfies stoichiometry. In the present embodiment, the silicon-rich silicon nitride film (in the present example, $Si_9N_{10}$) 15 is formed by greatly increasing the ratio of Si source gas to N source gas from the ordinary case.

Next, as shown in FIG. 1C, a 8-nm-thick silicon oxide film (control insulation film) 16 is formed on the silicon nitride film 15 by LPCVD. Then, a 200-nm-thick $n^+$ polysilicon film 17 is deposited on the control oxide film 16 by the CVD process, which serves as a control gate electrode. Furthermore, a resist pattern (not illustrated) is formed on the $n^+$ polysilicon film. Using the resist pattern as a mask, the $n^+$ polysilicon film 17, the control oxide film 16, the silicon nitride film 15, the tunnel insulation film 14, the nano-particle layer 13, and the tunnel insulation film 12 are patterned. Thereafter, phosphorus (P) is ion-implanted into the silicon substrate 11 under a condition of $1\times10^{15}$ cm$^{-2}$ dose rate and 15 KeV incident energy. Furthermore, by carrying out high-speed annealing at 1000° C. for 10 seconds, the $n^+$ impurity diffusion layer 18 which serves as the source region and the drain region is formed.

In this way, a floating gate type memory device is obtained as shown in FIG. 1C. In the floating gate type memory device, it is possible to bring in and out the information charge to and from traps of the charge storage portion (floating gate) 15 via nano-particle layer and double tunnel junction under the control of the control gate electrode 17. The floating gate type memory device obtained in this way is able to suppress percolation leakage between the source and the drain.

Since information write, read, and erase operations are same as those explained in the section of the Description of the Related Art, the description is omitted.

Now, the reasons why a memory device which has the above-mentioned structure can suppress percolation leakage between the source and the drain (between S/D) will be discussed.

First of all, using FIGS. 2A and 2B, the origin of percolation leakage between S/D will be described.

Figure 2A:
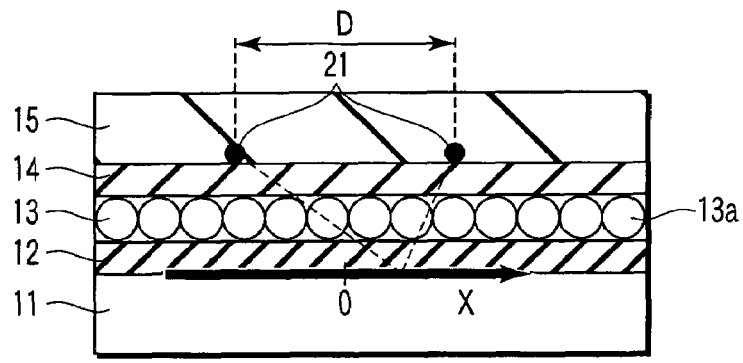
FIGS. 2A and 2B are views that indicate causes of percolation leakage between a source and a drain.
Figure 2B:
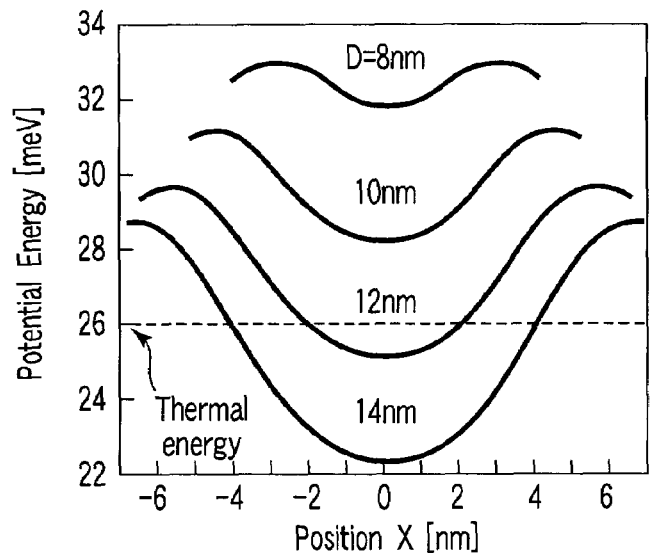

Assume a condition in which two electrons 21 are trapped with a distance D separated on the interface of the silicon nitride film 15 (FIG. 2A). Consideration will be made on the Coulomb potential on the Si channel surface due to these trap electrons 21. As shown in FIG. 2B, when the distance D is greater than about 10 nm, an area where the potential energy becomes lower than thermal fluctuation (26 meV) at room temperature appears. This low potential region is connected between S/D and a current path of percolation leakage is generated. As device size scaling advances in the memory device, this percolation leakage increases prominence.

In order to prevent the percolation leakage between S/D, it is important to reduce a region with lower potential than thermal fluctuation, which appears when the distance D becomes greater than about 10 nm. In the case where the trap electron can be retained to an area density greater than $1\times10^{12}$ cm$^{-2}$ (that is, one trap electron per 10 nm square) for 10 years or longer, the probability that the distance D increases from 10 nm is reduced. As a result, the percolation leakage can be prevented.

The condition to retain the trap electron for 10 years after write/erase can be determined from the measured value up to $10^5$ seconds and the theoretical value of tunnel probability.

Figure 3:
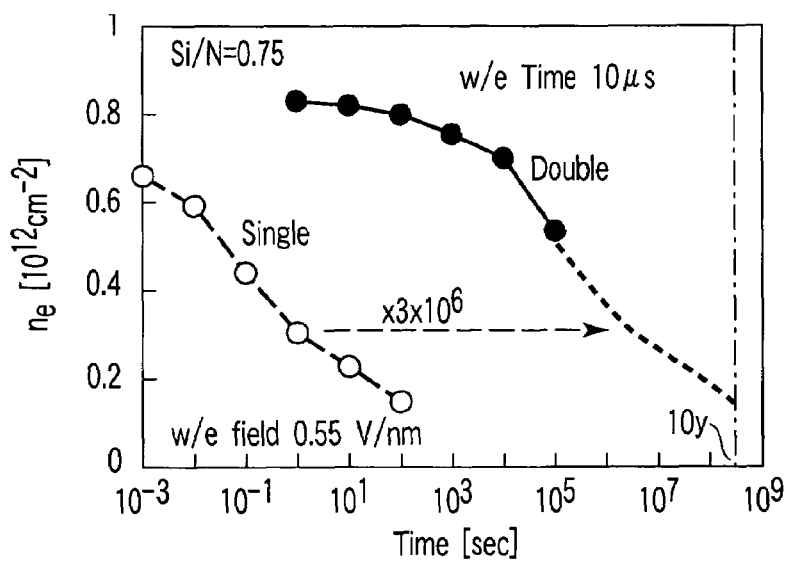
FIG. 3 is a view that relates to a prior art and shows the retention characteristics of the trap electron density.

FIG. 3 shows the retention characteristics of the trap electron density ($n_e$) when a normal silicon nitride film ($Si_3N_4$) which satisfies stoichiometry is used for the floating gate portion. FIG. 3 shows a case in which an electron tunnels via only one layer of 1-nm-thick tunnel oxide film ("Single" in FIG. 3) and a case in which an electron tunnels via double 1-nm-thick tunnel oxide films between which a 2-nm-thick Si nano-crystal film ("Double" in FIG. 3) is provided. In the latter case, the charge retention characteristics are improved exponentially by an energy barrier caused by Coulomb blockade effect and quantum confinement effect in the Si nanocrystal (for example, see R. Ohba et al.: IEEE Trans. on ED, 49 (2002) 1392). From the measurement, it is possible to confirm $3\times10^6$ times improvement in the retention characteristics. This $3\times10^6$ times improvement corresponds to about 0.5 eV energy barrier height in a 2-nm Si nano-crystal. This is a theoretically possible barrier height (for example, see R. Ohba et al. Digest of VLSI Tech. 2003 p. 35). In FIG. 3, theoretical prediction after $10^5$ seconds is shown in a dotted line. In the conventional normal silicon nitride film ($Si_3N_4$ film), the area density equal to or greater than $1\times10^{12}$ cm$^{-2}$ which can prevent the percolation leakage between S/D cannot be maintained.

Figure 4:
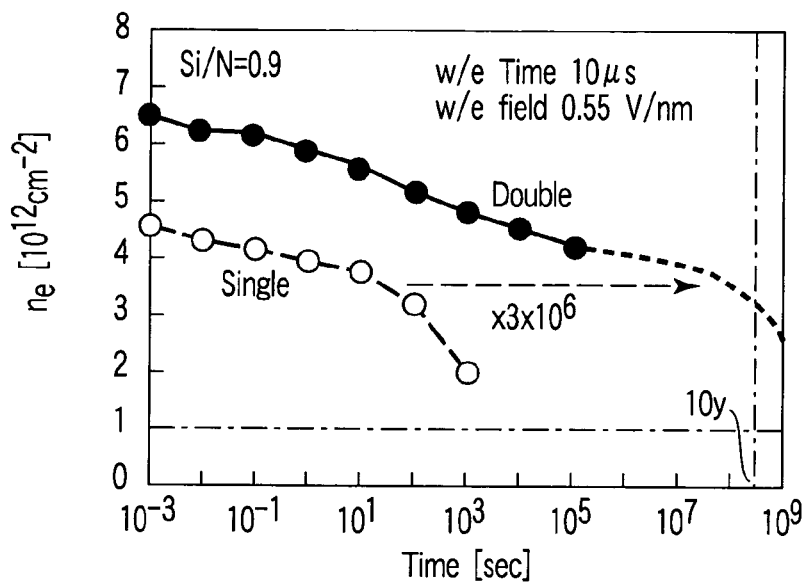
FIG. 4 is a view that relates to embodiments of the present invention and shows the retention characteristics of the trap electron density.

FIG. 4 shows the trap electron density retention characteristics of the Si-rich nitride film ($Si_9N_{10}$ film) of the present embodiment. It indicates that the area density equal to or greater than $1\times10^{12}$ cm$^{-2}$ is maintained for 10 years. Consequently, the memory device of the present embodiment can suppress the percolation leakage between S/D.

The increase of trap electron density is caused by an increase in traps near the bottom of the Si conduction band due to the dangling bond of Si atoms increased by the Si-rich nitride film. In the silicon nitride film (Si/N=3/4) which satisfied stoichiometry, 7.5 Si atoms exist with respect to 10 N atoms. In the silicon nitride film (Si/N=9/10) of the present embodiment, 9 Si atoms exist with respect to 10 N atoms. Consequently, 0.079 ((9−7.5)/(9+10)=0.079) excess Si atoms exist per 1 atom. This excess Si atom is substituted for the N atom which has three valence electrons. Since the valence electron of Si is four, one valence electron remains. Consequently, 0.079 pieces of dangling bonds arising from the Si atom are generated per 1 atom. Because the trap electron density increases due to this dangling bond, it becomes possible to prevent percolation leakage between S/D over a period of more than 10 years.

Figure 5:
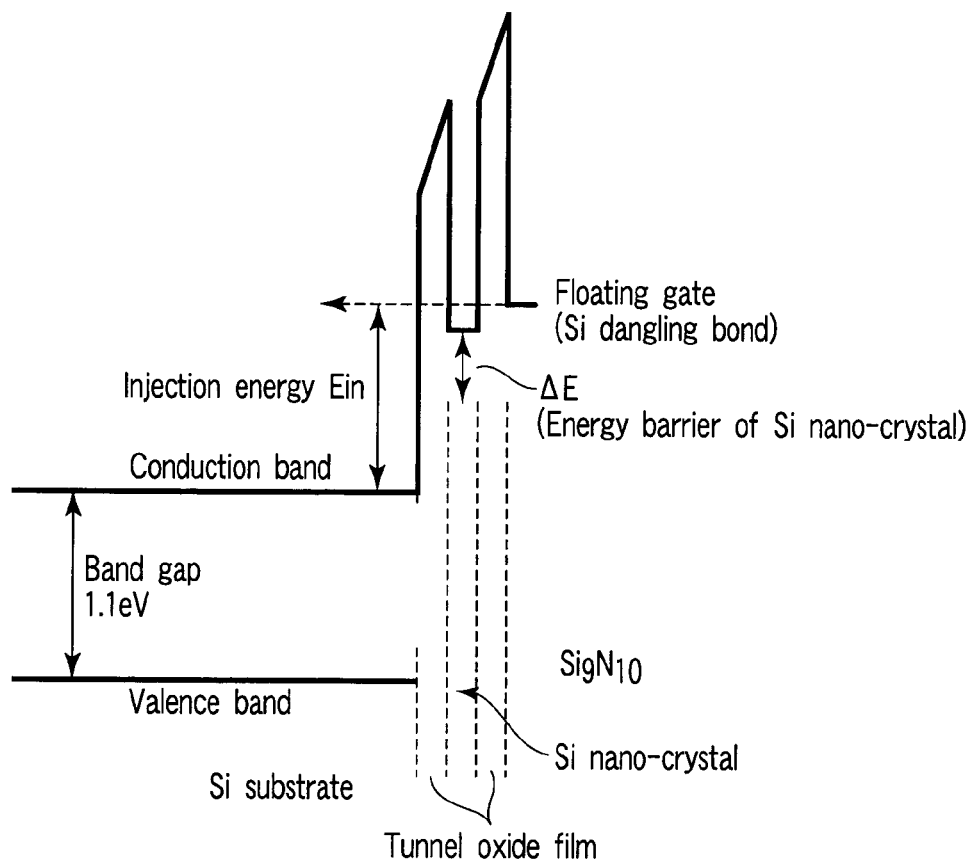
FIG. 5 is an energy band diagram that shows a degradation mechanism of a tunnel oxide film.

Description will be made later on how many dangling bonds arising from the Si atom should be required per one atom. In this part of the section, desirable write/erase conditions will be discussed. In FIGS. 3 and 4, 5.5 MV/cm (0.55 V/nm) is used for the write/erase electric field. Note that the write/erase electric field is the electric field perpendicular to the channel, which is applied to tunnel oxide films 12 and 14 when the write/erase voltage is applied to the control gate electrode. For example, the value obtained by dividing the write/erase voltage by the effective oxide thickness between the channel and the control gate electrode is a typical write/erase electric field value. A desirable range of the write/erase electric field is determined from the demand for securing reliability of the tunnel oxide film.

Degradation of the tunnel oxide film is caused by the injection of a hole due to impact ionization. FIG. 5 is an energy band diagram at the time of erasing to show a degradation mechanism of the tunnel oxide film. At the time of erasing, the erasing voltage is set in such a manner as to apply a potential difference larger than the energy barrier ΔE caused by Si nano-particles (Si-nanocrystals) to each tunnel oxide film. By this, the information electron inside the floating gate (charge storage portion) is discharged to the Si substrate without being blocked by the energy barrier ΔE. In the case where the injection energy $E_{in}$ is greater than 1.1 eV of band gap of the Si substrate, impact ionization occurs in the Si substrate. As a result, holes are generated in the valence band and degradation of tunnel oxide film occurs due to hole injection. When the potential difference in each tunnel oxide film is less than half (0.55 eV) the band gap (1.1 eV) of the Si substrate, the injection energy Ein does not become greater than the band gap. Consequently, it is possible to prevent degradation of tunnel oxide film caused by impact ionization. In the present embodiment, the tunnel oxide film is 1 nm thick. Consequently, the desirable write/erase electric field is about 0.55 V/nm (5.5 MV/cm) or less.

The write/erase time is about 100 μs for NAND memory and about 10 μs for NOR memory, which are typical flash memories. The write/erase time may be shorter than those.

Figure 6:
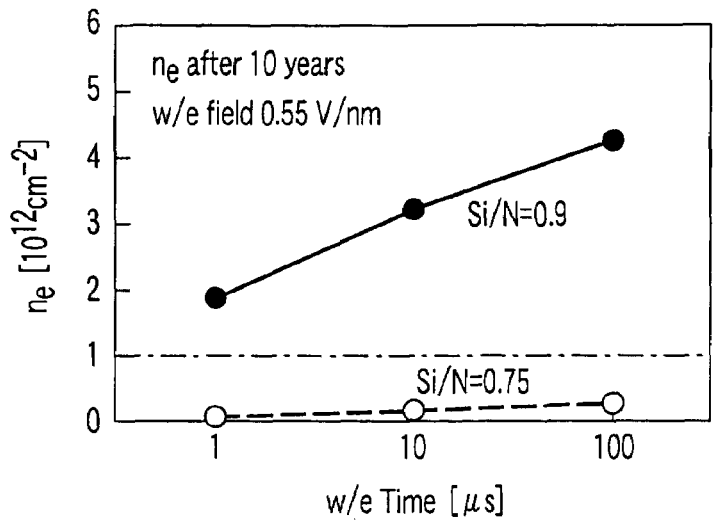
FIG. 6 is a view that compares the present embodiment and the prior art with respect to the write/erase time dependency of trap electron density after 10 years.

FIG. 6 compares the present embodiment with the conventional technique with respect to the write/erase time (w/e time) dependency of trap electron density $n_e$ after 10 years. It indicates that in the present embodiment, the area density greater than $1 \times 10^{12}$ cm$^{-2}$ can be maintained, which can prevent percolation leakage between S/D, in a wide range of less than 100 μs write/erase time at the 5.5 MV/cm (0.55 V/nm) write/erase electric field.

Second Embodiment

Next description will be made on the nonvolatile semiconductor memory device (floating gate type memory device) related to the second embodiment. In the first embodiment, a silicon-rich silicon nitride film was used for the charge storage portion (floating gate electrode) 15, but in the present embodiment, silicon-rich silicon oxide film is used.

Now, the manufacturing process of the present embodiment will be described. For the basic process other than the process for the silicon-rich silicon oxide film as the charge storage portion 15 is the same as that of the first embodiment. Therefore, in the preset embodiment, referring to FIGS. 1A to 1C used in the first embodiment, the manufacturing process will be described.

First of all, as shown in FIG. 1A, same as the first embodiment, the tunnel insulation film (silicon oxide film) 12, the nano-particle layer 13 having conductive nano-particles (nano-crystal silicon grains) 13a which satisfy the Coulomb blockade condition, and the tunnel insulation film (silicon oxide film) 14 are formed on the silicon substrate (semiconductor substrate) 11.

Next, as shown in FIG. 1B, a 20-nm-thick silicon-rich silicon oxide film 15 that serves as the charge storage portion (floating gate) is formed by the LPCVD process. The silicon oxide film 15 has a silicon composition ratio higher than the silicon composition ratio of a silicon oxide film which satisfies stoichiometry. That is, the silicon oxide film 15 has a higher composition ratio Si/O than that of a silicon oxide film $SiO_2$ (Si/O=1/2=0.50) which satisfies stoichiometry. In the present embodiment, a silicon-rich silicon oxide film ($Si_{1.1233}O_2$ in the present example) 15 is formed by greatly increasing the ratio of Si source gas to oxygen source gas from the ordinary cases.

Then, as shown in FIG. 1C, the control insulation film 16, the control gate electrode 17 formed with n$^+$ polysilicon film, and the n$^+$ impurity diffusion layer 18 which serves as source/drain are formed, same as the first embodiment.

In this way, a floating gate type memory device is obtained as shown in FIG. 1C. In the floating gate type memory device, it is possible to bring in and out the information charge to and from traps of the charge storage portion (floating gate) 15 via nano-particle layer and double tunnel junction under the control of the control gate electrode 17. The floating gate type memory device obtained in this way is able to suppress percolation leakage between the source and the drain.

Now, the reasons why the memory device which has the above-mentioned structure can suppress the percolation leakage between source and drain (between S/D) will be discussed.

In the present embodiment, the silicon oxide film ($Si_{1.1233}O_2$) of the charge storage portion has a Si-rich composition ratio (Si/O=1.1233/2) as compared to the composition ratio (Si/O=1/2) of a silicon oxide film ($SiO_2$) which satisfies stoichiometry. This means that there exist 0.0395 (0.1233/(1.1233+2)=0.0395) excess Si pieces per 1 atom as compared to the silicon oxide film ($SiO_2$) which satisfies stoichiometry. This excess Si atoms is substituted for the oxygen atom which has two valence electrons. Since the valence electron of Si is four, two valence electron remains. Therefore, two dangling bonds arising from the Si valence electrons are generated. Consequently as compared with the case of the first embodiment in which excess Si is substituted for nitrogen with three valence electrons, nearly double Si dangling bonds are generated. The number of excess atoms, 0.0395, per one atom is one half the number of excess atoms, 0.079, of the first embodiment. Consequently, in the present embodiment, the number of Si dangling bonds per one atom becomes the same as that in the case of the first embodiment. Consequently, in the present embodiment as well, the same trap electron retention characteristics as those of the first embodiment can be obtained.

With the foregoing description, same as in the first embodiment, the area density greater than $1 \times 10^{12}$ cm$^{-2}$ can be maintained for 10 years or more, which can prevent percolation leakage between S/D in a wide range of less than 100 μs write/erase time at the 5.5 MV/cm (0.55 V/nm) write/erase electric field, in the present embodiment as well.

Third Embodiment

Next description will be made on the nonvolatile semiconductor memory device (floating gate type memory device) related to the third embodiment. In the first embodiment, a silicon-rich silicon nitride film has been used for the charge storage portion (floating gate) 15, but in the present embodiment, a silicon-rich silicon oxinitride film is used.

Now, the manufacturing process of the present embodiment will be described. For the basic process other than the process for the silicon-rich silicon oxinitride film as the charge storage portion 15 is the same as that of the first embodiment. Therefore, in the preset embodiment, the manufacturing process will be described with reference to FIGS. 1A to 1C used in the first embodiment.

First of all, as shown in FIG. 1A, same as the first embodiment, the tunnel insulation film (silicon oxide film) 12, the nano-particle layer 13 having conductive nano-particles (nano-crystal silicon grains) 13a which satisfy the Coulomb blockade condition, and the tunnel insulation film (silicon oxide film) 14 are formed on the silicon substrate (semiconductor substrate) 11.

Next, as shown in FIG. 1B, a 20-nm-thick silicon-rich silicon oxinitride film 15 that serves as the charge storage portion (floating gate) is formed by the LPCVD process. The silicon oxinitride film 15 has a silicon composition ratio higher than the silicon composition ratio of a silicon oxinitride film which satisfies stoichiometry. That is, the silicon oxinitride film 15 has a higher silicon composition ratio than that of a silicon oxinitride film $(SiO_2)_X(Si_3N_4)_{1-X}$ (where, $0<X<1$) which satisfies stoichiometry and is expressed as $Si_Y(SiO_2)_X(Si_3N_4)_{1-X}$ (where, $0<X<1, Y>0$). Specifically, the silicon oxinitride film is formed in such a manner as to satisfy the following X and Y relationship:

$$Y=0.079(7-4X)(4-2X)/[4-0.079(4-2X)].$$

A silicon-rich silicon oxinitride film 15 can be formed by greatly increasing the ratio of Si source gas to oxygen source gas and nitrogen source gas from the ordinary cases.

Then, as shown in FIG. 1C, the control insulation film 16, control gate electrode 17 formed with n+ polysilicon film, and n+ impurity diffusion layer 18 which serves as source/drain are formed, same as the first embodiment.

In this way, a floating gate type memory device is obtained as shown in FIG. 1C. In this floating gate type memory device, it is possible to bring in and out the information charge to and from traps of the charge storage portion (floating gate) 15 via nano-particle layer and double tunnel junction under the control of the control gate electrode 17. The floating gate memory device obtained in this way can suppress percolation leakage between the source and the drain.

Now, the reasons why the memory device which has the above-mentioned structure can suppress the percolation leakage between source and drain (between S/D) will be discussed.

In the present embodiment, the silicon oxinitride film of the charge storage portion has a Si-rich composition ratio as compared to the composition ratio of a silicon oxinitride film $(SiO_2)_X(Si_3N_4)_{1-X}$ which satisfies stoichiometry and is expressed as $Si_Y(SiO_2)_X(Si_3N_4)_{1-X}$. The X and Y relationship is given by:

$$Y=0.079(7-4X)(4-2X)/[4-0.079(4-2X)].$$

The number of excess Si atoms per one atom is $Y/(Y+7-4X)$. This excess Si atom is substituted for the oxygen atom or nitride atom. In such a case, it is assumed that the excess Si atom is substituted for the oxygen atom or nitride atom with probability that corresponds to the atom ratio of oxygen to nitrogen. That is, the excess Si atom is substituted for the oxygen atom with probability of $2X/(4-2X)$ and for the nitrogen atom with probability of $(4-4X)/(4-2X)$.

The contribution to the Si dangling bond when the excess Si atom is substituted for the oxygen atom as in the case of the second embodiment is double that when the excess Si atom is substituted for nitrogen atom as in the case of the first embodiment. Consequently, it can be expressed by:

$$[2\times 2X/(4-2X)+(4-4X)/(4-2X)]\times[Y/(Y+7-4X)]=0.079.$$

That is, 0.079 pieces per 1 atom contributes to the Si dangling bond. This value of 0.079 is the same as that of the first embodiment. Consequently, in the present embodiment as well, the same trap electron retention characteristics as those of the first embodiment can be obtained.

Consequently, same as in the first embodiment, the area density greater than $1\times 10^{12}$ cm$^{-2}$ can be maintained for 10 years or more, which can prevent percolation leakage between S/D in a wide range of less than 100 μs write/erase time at the 5.5 MV/cm (0.55 V/nm) write/erase electric field, in the present embodiment as well.

The first to third embodiments have been described as above, and now, description will be made as follows on the desirable conditions of the floating gate type memory device.

Figure 7:
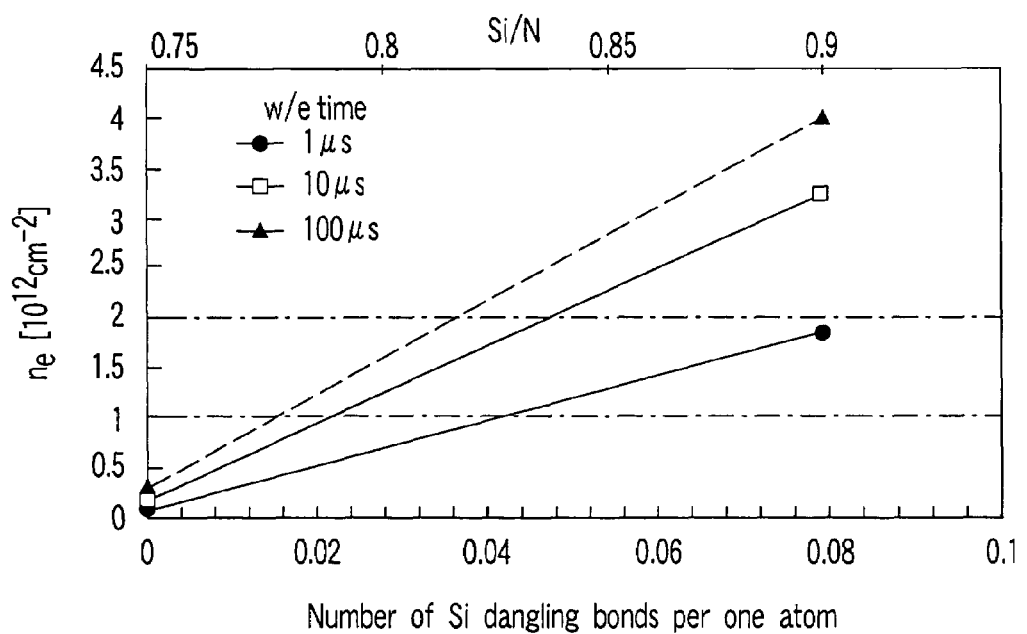
FIG. 7 is a view that indicates the trap electron density after 10 years with respect to the number of Si dangling bonds per one atom.
Figure 8:
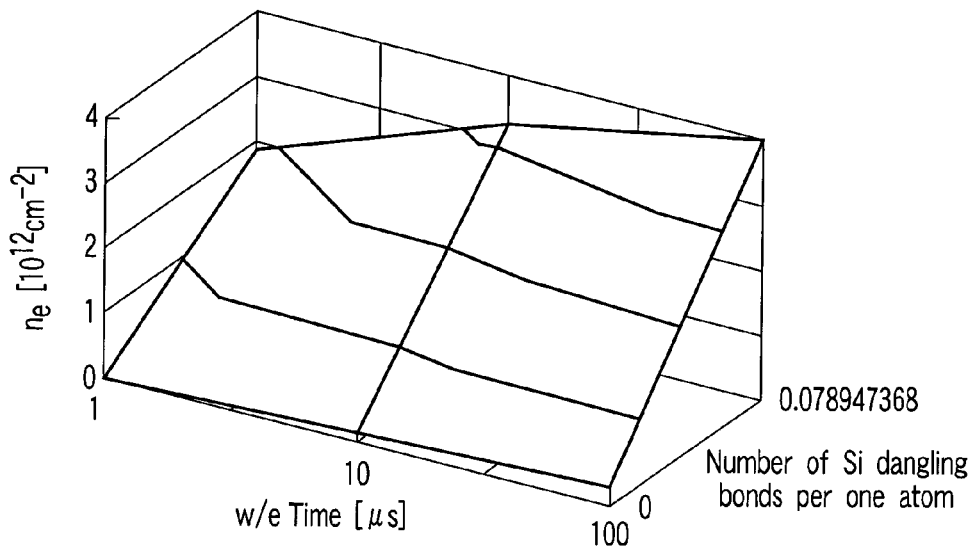
FIG. 8 is a view that indicates the trap electron density after 10 years with respect to the number of Si dangling bonds per one atom.

In the Si-rich nitride film $Si_UN$ (where, $U>0.75$) as described in the first embodiment, the excess Si atom is substituted for the nitride atom with three valence electrons. In such a case, since Si has four valence electrons, dangling bond arising from the Si atom is generated. That is, the Si dangling bond density increases almost linearly with respect to the number of excess Si atoms $(U-0.75)/(1+U)$ per one atom. Consequently, the trap electron density increases almost linearly with respect to $(U-0.75)/(1+U)$. FIG. 6 indicates the trap electron density $n_e$ after 10 years when $U=0.75$ and when $X=0.9$. Consequently, based on the linearity rule of the number of Si dangling bonds $(U-0.75)/(1+U)$ per one atom, the trap electron density $n_e$ after 10 years can be obtained for all the cases of $U>0.75$. FIG. 7 is the figure that indicates the trap electron density $n_e$ after 10 years with respect to the number of Si dangling bonds per 1 atom. FIG. 8 three-dimensionally expresses the characteristics of FIG. 7 (contour plan). The $1\times 10^{12}$ cm$^{-2}$ contour line gives the lower limit of the desirable Si/N composition ratio U with respect to each write/erase time (w/e time) when writing/erasing is carried out in the 5.5 MV/cm (0.55 V/nm) electric field.

Now the description will be made on the film thickness of each tunnel oxide film (tunnel insulation film) and the diameter of Si nano-crystal (Si nano-particle). The thinner the tunnel oxide film, the better for device size scaling. In each of the above-mentioned embodiments, the tunnel oxide film is 1 nm thick. Because this thickness is the typical controllable thinnest thickness, it is practically most desirable value. In addition, the energy barrier of 2-nm-diameter Si nano-crystal is 0.5 eV. As the energy barrier is reduced, retention characteristics are degraded, and excessively low energy barrier is not desirable. In addition, when the energy barrier is higher than 0.5 eV, it might be unable to obtain the satisfactory writing/erasing speed in the 5.5 MV/cm electric field, which is desirable from the viewpoint of rewrite durability. Consequently, the value of 0.5 eV is the practically most desirable barrier height. Consequently, the contour line of $1\times 10^{12}$ cm$^{-2}$ shown in FIG. 8 provides the most desirable typical value which satisfies nonvolatility, device scaling, reliability, and high speed.

With the foregoing description, the value at $n_e=1\times 10^{12}$ cm$^{-2}$ in the 100-μs write/erase time shown in FIG. 7, that is, the number of Si dangling bonds per one atom of 0.016 and the corresponding composition ratio Si/N=0.78 provide the desirable lower limit. Consequently, in the case where the Si/N ratio is higher than 0.78 (the number of Si dangling bonds per one atom is greater than 0.016), it is possible to configure a memory device which satisfies nonvolatility, device scaling, reliability, and high speed.

The $1\times 10^{12}$ cm$^{-2}$ area density is the area density in which one trap electron exists at the center of a square, 10 nm on a side, when trap electrons are arranged on a periodic basis. In such a case, with respect to the diagonal direction, the distance between trap electrons is longer than 10 nm. The area density when one trap electron exists at the center of a square, with diagonal line 10 nm long ($5\times 2^{1/2}$ nm on a side), is $2\times 10^{12}$ cm$^{-2}$. Consequently, the lower limit of the more preferable Si/N composition ratio to suppress the percolation leakage between S/D is the Si/N composition ratio that corresponds to the trap electron density $n_e=2\times 10^{12}$ cm$^{-2}$. In such a case, the values at $n_e=2\times 10^{12}$ cm$^{-2}$ in the write/erase time 100 μs shown in FIG. 7, that is, 0.037, the number of Si dangling bonds per 1 atom and the corresponding composition ratio Si/N=0.82, become the lower limit values.

In the case where the above-described matter is expressed by the equation, $$(U-0.75)/(U+1) \geqq 0.016$$

is desirable, and, $$(U-0.75)/(U+1) \geqq 0.037$$

is more desirable.

There are cases in which the write/erase time per 1 memory element is shorter than about 100 μs of NAND flash memory. In such a case, it is desirable to have a still higher Si/N composition ratio in order to achieve a sufficient electron density even in a short write/erase time. Consequently, even in such a case, the number of Si dangling bonds per one atom and the Si/N composition ratio are included in the range defined by the above-mentioned lower-limit value.

In addition, even when the tunnel oxide film is thicker than 1 nm, it provides sufficient advantages as compared to the present tunnel oxide film thickness of about 8 nm of the flash memory. In such a case, it is desirable to have a still higher Si/N composition ratio in order to obtain the sufficient information electron density at the time of writing/erasing even with a thick tunnel oxide film. Consequently, even in such a case, the number of Si dangling bonds per one atom and the Si/N composition ratio are included in the range defined by the above-mentioned lower-limit value. Note that the sufficient information electron density is unable to be obtained unless the information electrons directly tunnel the tunnel oxide film. Consequently, the upper limit of the tunnel oxide film thickness is about 3 nm which corresponds to the upper limit of the direct tunneling.

In addition, it is possible to make the tunnel oxide film thickness thinner than 1 nm. When the native oxide film formed in the atmosphere is used, the tunnel oxide film is about 0.8 nm thick. Consequently, the lower limit of the tunnel oxide film thickness is about 0.8 nm. In the case where the tunnel oxide film is thinner than 1 nm, it is advantageous to obtain greater information electron density at the time of writing/erasing. Consequently, the above-mentioned Si/N composition ratio is effective for the sufficient condition of a desirable range. In actuality, since the film thickness less than 1 nm has no sufficient margin, the lower limit of the Si/N composition ratio in the case of 1 nm film thickness as described above would be appropriate.

In each of the above-mentioned embodiments, the most desirable average diameter of Si nano-particle is set to be about 2 nm, but it may be any particle diameter which satisfies the Coulomb blockade conditions. If the Coulomb blockade conditions are satisfied, the effects of the Si nano-particle energy barrier become effective. Consequently, the lower limit of the desirable Si/N composition ratio found at 2 nm grain diameter becomes effective. To satisfy the Coulomb blockade condition means that the electro-static energy of one electron (Coulomb blockade energy: represented by q/2Cdot, where q denotes the elementary electric charge, and Cdot denotes the Si nano-particle capacitance) is greater than 26 meV thermal fluctuation at room temperature. In the Si nano-crystal of about 15 nm grain diameter, Cdot is about 3 aF. Consequently, the Coulomb blockade energy ΔE becomes 27 meV (ΔE=q/2Cdot=27 meV) and becomes nearly equal to the thermal energy at room temperature of 26 meV. Because the Coulomb blockade energy increases as the grain diameter decreases, the upper limit of the grain diameter is 15 nm. In addition, the lower limit of the grain diameter is 0.4 nm interatomic distance of Si.

In the case where the average grain diameter of Si nano-particles is greater than 2 nm, the energy barrier ΔE decreases and the retention characteristics are degraded. Consequently, still higher Si/N composition ratio is desirable. Consequently, even in the case where the average grain diameter of Si nano-particles is greater than 2 nm, the range defined by the desirable Si/N composition ratio is effective. In addition, the retention characteristics are improved when the average grain diameter is smaller than 2 nm. Consequently, the Si/N composition ratio when the grain diameter is 2 nm is effective for sufficient conditions.

For the Si-rich oxide films as is the case of the second embodiment, the discussion same as the above-mentioned Si-rich nitride film holds.

In the case of the Si-rich silicon oxide film $Si_VO$ (where V>0.5), the number of Si dangling bonds per one atom can be given by $2 \times (V-0.5)/(V+1)$. As is the case of the above-mentioned Si-rich nitride film, assume that the lower-limit value of the number of Si dangling bonds per 1 atom be 0.016, we have $$2 \times (V-0.5)/(V+1) \geqq 0.016$$

and V≧0.512. Consequently, it is desirable that the Si/O composition ratio is 0.512 or more.

Furthermore, as is the case of the Si-rich nitride film mentioned above, assume that the lower limit value of the number of Si dangling bonds per 1 atom be 0.037, we have $$2 \times (V-0.5)/(V+1) \geqq 0.037$$

and V≧0.528. Consequently, it is more desirable that Si/O composition ratio is 0.528 or more.

For the Si-rich oxinitride films as is the case of the third embodiment, the discussion same as the above-mentioned Si-rich nitride film holds.

The case of Si-rich oxinitride film $Si_Y(SiO_2)_X(Si_3N_4)_{1-X}$ (where, 0<X<1, Y>0) is same as that of the Si-rich nitride film described above. That is, with the lower limit value of the number of Si dangling bonds per 1 atom set to 0.016, the Y value is desirable to be the value which satisfies the following equation:

$$[2 \times 2X/(4-2X)+(4-4X)/(4-2X)] \times [Y/(Y+7-4X)] \geqq 0.016.$$

Further, same as the Si-rich nitride film described above, if the lower limit value of the number of Si dangling bonds per 1 atom set to 0.037, the Y value is more desirable to be the value which satisfies the following equation:

$$[2 \times 2X/(4-2X)+(4-4X)/(4-2X)] \times [Y/(Y+7-4X)] \geqq 0.037.$$

In each of the embodiments mentioned above, silicon is used for the material of the semiconductor substrate but other semiconductor material may be used.

In each of the above-mentioned embodiments, silicon oxide ($SiO_2$) is used for the tunnel insulation film, but even when other insulation material is used, the similar effects can be expected if the material has the same tunnel resistance as that of silicon oxide. In addition, in each of the above-mentioned embodiments, the two tunnel insulation films have the same film thickness, but the film thickness of the two tunnel insulation film may differ from each other, if they are 3 nm thick or less, which enables direct tunneling.

In each of the above-mentioned embodiments, the conductive nano-particles provided between thin tunnel insulation films were Si nano-crystals, but even when other conductive material is used, the same effects can be expected if the Coulomb blockade condition is satisfied.

In addition, in each of the above-mentioned embodiments, Coulomb blockage energy of conductive nano-particles is used as an energy barrier provided between thin tunnel insulation films. By blocking charging and discharging by the Coulomb blockade energy, long-time retention of electric charge is enabled. In addition, by applying the write and erase voltages exceeding the Coulomb blockade energy, high-speed write and erase are enabled (see Jpn. Pat. Appln. KOKAI Publication No. 2002-289710).

Figure 9:
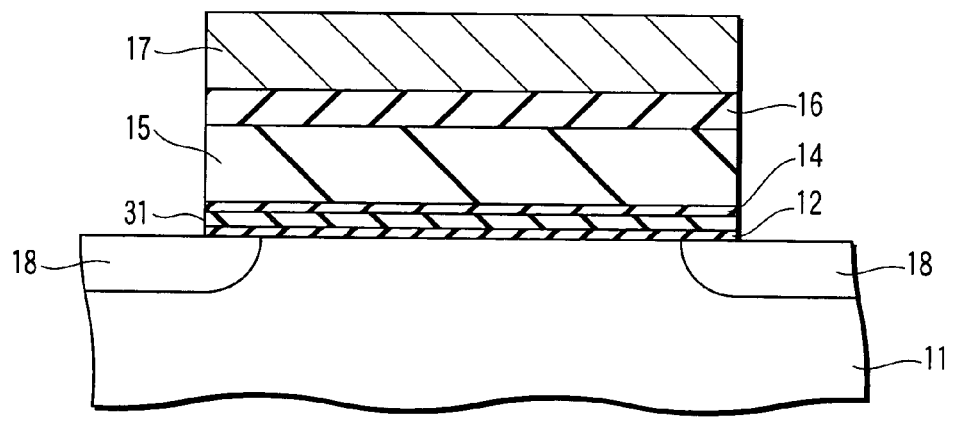
FIG. 9 is a cross-sectional view that schematically indicates a modification example of the nonvolatile semiconductor memory device according to the first to third embodiments of the present invention.

Further, it is possible to use a layer with a plurality of traps as the energy barrier layer provided between thin tunnel insulation films. FIG. 9 shows the structure. The basic structure other than the energy barrier layer 31 is same as the structure of FIG. 1C. In such a case, charging and discharging are interrupted by the energy difference between the traps in the energy barrier layer 31 and the bottom of the conduction band of the channel semiconductor. By applying appropriate write and erase voltage that exceeds this energy difference, it is possible to write and erase at a high speed (for example, see Jpn. Pat. Appln. KOKAI Publication No. 2000-81500). In this way, even when a layer which has a plurality of tarps is used in place of a nano-particle layer as the energy barrier layer, the effects same as those already described can be obtained. That is, the percolation leakage between the source and the drain can be suppressed.

Moreover, it is possible to use an insulation layer whose energy at the bottom of the conduction band is higher than that of the channel semiconductor as the energy barrier layer 31 (see FIG. 9) provided between thin tunnel insulation films. In such a case as well, the basic structure other than the energy barrier layer 31 is the same as the structure of FIG. 1C. In this structure, charging and discharging are interrupted by the energy difference between the bottom of the conduction band of the insulation layer (energy barrier layer 31) and the bottom of the conduction band of the channel semiconductor. By applying appropriate write and erase voltage that exceeds this energy difference, it is possible to write and erase at a high speed. In this way, even when the above described insulation layer is used in place of a nano-particle layer as the energy barrier layer, the effects same as those already described can be obtained. That is, the percolation leakage between the source and the drain can be suppressed.

In FIGS. 1C and 9, the control insulation film 16 is formed on the charge storage portion 15, and the control electrode 17 that controls the energy barrier height is formed on the control insulation film 16. That is, the control electrode 17 is formed indirectly on the charge storage portion 15. However, the control electrode 17 may be formed directly on the charge storage position 15 without forming the control insulation film 16.

In addition, in each of the above-mentioned embodiments, it has been said desirable that the write and erase electric fields should be 5.5 MV/cm or lower. This is because the injection energy Ein shown in FIG. 5 should be desirable to be less than 1.1 eV Si band gap for prevention of oxide film degradation. However, the write and erase electric fields may exceed 5.5 MV/cm if the write/erase cycle endurance requirement is satisfied. In such a case, the number of injected information electrons is greater than that when the write and erase electric fields are 5.5 MV/cm. Consequently, as far as the preferable excess Si atom conditions are satisfied, the information electron density which can suppress percolation leakage can be maintained for more than 10 years.

In addition, in each of the above-mentioned embodiments, there is no need that all the Si nano-particles contained in the nano-particle layer must satisfy the Coulomb blockade condition. Amorphous Si or large Si crystals which do not satisfy the Coulomb blockade condition may be contained in the nano-particle layer. It is only required that Si nano-crystals which satisfy the Coulomb blockade condition should be contained in the nano-particle layer at the area density of $1\times10^{12}$ cm$^{-2}$ or more (more preferably, more than $2\times10^{12}$ cm$^{-2}$). Even in such a case, it is possible to suppress the percolation leakage.

In each of the above-mentioned embodiments, a plurality of conductive nano-particles between thin tunnel insulation films are provided with respect to one memory element, but at least one conducive nano-particle may be provided with respect to one memory element.

Further, in each of the above-mentioned embodiments, the nano-particle layer has been a double tunnel junction provided between two tunnel insulation films. However, the multiple tunnel junction may be adopted in which the nano-particle layer and the tunnel insulation film are alternately stacked and charge and discharge may be carried out via the multiple tunnel junction.

Moreover, in each of the above-mentioned embodiments, the supply source of information charges to the floating gate (charge storage portion) has been the channel at the semiconductor substrate surface. However, the n$^+$ silicon of the control gate electrode may be used for the supply source of information charges.

In addition, in each of the above-mentioned embodiments, the floating gate memory based on N-type MOSFET has been described, but the same configuration can be applied to the floating gate memory based on P-type MOSFET as well. For example, the tunnel resistance of the tunnel oxide film with respect to the hole or Si nano-particle barrier ΔE should be adjusted to have the same values as in the case of N-type MOSFET.

Furthermore, in each of the above-mentioned embodiments, Si-rich silicon nitride film, silicon oxide film or silicon oxinitride film are used for the floating gate (charge storage portion). However, insulation films of such films containing elements (for example, metals) other than Si, O, and N may be used. Even in such a case, effects same as those obtained with each of the above-mentioned embodiments can be expected as far as the number of Si dangling bonds per one atom is within the above-mentioned range.

Let $Si_Y(SiO_2)_X(Si_3N_4)_{1-X}M_Z$ (where, M is at least one element other than Si, O and N; $0 \leq X \leq 1$; $Y>0$; $Z \geq 0$) denote the above described insulation film. In such a case, it is desirable to have $$[2\times 2X/(4-2X)+(4-4X)/(4-2X)]\times[Y/(Y+7-4X+Z)] \geq 0.016,$$

and it is more preferable to have $$[2\times 2X/(4-2X)+(4-4X)/(4-2X)]\times[Y/(Y+7-4X+Z)] \geq 0.037.$$

In each of the above mentioned embodiments, based on the desirable lower limit of the number of Si dangling bonds per 1 atom, the desirable lower limit of excess Si content ratio Y was shown. Now, the desirable upper limit of excess Si content ratio Y will be described.

The number of Si dangling bonds increases as the excess Si content ratio Y increases. However, when Y increases excessively, Si—Si bond network is formed. As a result, by rebonding of Si dangling bonds, the number of Si dangling bonds decreases and sufficient effects are unable to be obtained.

In the Si-rich nitride film $Si_UN$ (where, U>0.75), formation of Si—Si rebond network becomes conspicuous when U=1/1.1=about 0.91 (for example, J. Robertson, 1994, Phil. Mag. B, vol. 69, pp. 307-326). In the case of U=1/1.1, the number of excess Si atoms per 1 atom is $(U-0.75)/(U+1)=1/12$. That is, one excess Si atom per 12 atoms is generated. That is, when $U=1/1.1$ is achieved, the Si—Si bond network begins to be formed, and the number of Si dangling bonds decreases because of the rebond of Si atoms. Consequently, even when Si is brought excessively, the number of Si dangling bonds does not increase excessively.

It is assumed that the Si—Si bond network formation is determined by the probability in which excess Si atoms distributed randomly in the film encounter with one another. Consequently, it is assumed that the Si—Si bond network formation is determined not by whether it is nitride film or oxide film but by the number of excess Si atoms per one atom. In the case of Si-rich oxide film $Si_VO$ (where, $V>0.5$), let the number of excess Si atoms per one atom be $(V-0.5)/(V+1)=1/12$; then, $V=0.64$. Consequently, it is assumed that the Si—Si bond network begins to be formed with $V=0.64$ set as the boundary. In actuality, it has been reported that the Si—Si bond network begins to be formed with $V=1/1.5=$about 0.67 set as the boundary (for example, E. Martinez et al., 1981, Phys. Rev. B, vol. 24, pp. 5718-5725).

In Si-rich oxinitride film $Si_Y(SiO_2)_X(Si_3N_4)_{1-X}M_Z$ (where, M is at least one element (for example, metal element) other than Si, O, and N; $0 \leq X \leq 1$; $Y>0$; $Z \geq 0$), the Si—Si bond network begins to be formed with the number of excess Si atoms per 1 atom $Y/(Y+7-4X+Z)=1/12$ set as the boundary. As a result, by rebonding of Si atoms, the number of Si dangling bonds decreases and sufficient effects are unable to be obtained.

Based on the foregoing, the upper limit (first upper limit) of the number of excess Si atoms per one atom is $1/12$. In addition, from the following viewpoint, it is possible to determine the upper limit (second upper limit) of the number of excess Si atoms per one atom can be determined.

For example, in the case of Si-rich nitride film $Si_UN$, it has already been described that the composition ratio $U=Si/N=0.78$ gives the desirable lower limit of the number of Si dangling bonds and $U=Si/N=0.82$ gives still more desirable lower limit. That is, it is desirable to be greater than the number of Si dangling bonds when the U value is about 0.8. According to the observation of the spin density concerning Si dangling bond by the electron spin resonance (ESR) of the Si-rich nitride film (for example, S. Hasegawa et al., 1991, Appl. Phys. Lett., Vol. 58, pp. 741-743, particularly, FIG. 3), if $U=Si/N=$about 2 or less, the Si dangling bond density when the U value is about 0.8 can be secured. In the case of $U=2$, the number of excess Si atoms per 1 atom is $(U-0.75)/(U+1)=5/12$. Consequently, the upper limit (second upper limit) of the number of excess Si atoms per 1 atom is $5/12$.

In Si-rich oxinitride film $Si_Y(SiO_2)_X(Si_3N_4)_{1-X}M_Z$ (where, M is at least one element (for example, metal element) other than Si, O, and N; $0 \leq X \leq 1$; $Y>0$; $Z \geq 0$) as well, the upper limit of the number of excess Si atoms per 1 atom is $5/12$.

Even when the number of excess Si atoms per 1 atom exceeds $5/12$, if the Si-rich oxinitride film can be formed at extremely low temperature and extremely low temperature can be maintained through the memory forming process in the future, Si—Si bond may be able to be kept to the non-equilibrium state. In such a case, reduction of Si dangling bonds caused by rebonding of Si atoms can be suppressed. Consequently, there would be a possibility to secure the desirable lower limit or more for the number of Si dangling bonds.

In addition, in $Si_Y(SiO_2)_X(Si_3N_4)_{1-X}M_Z$ (where, M is at least one element other than Si, O, and N; $0 \leq X \leq 1$; $Y>0$; $Z \geq 0$), even when the number of excess Si atoms per one atom exceeds $5/12$, selecting an appropriate element M can exert effects on the Si—Si bond condition. As a result, it becomes possible to suppress the reduction of Si dangling bonds caused by rebonding of Si atoms. Consequently, there is a possibility that the lower limit or more of the desirable number of Si dangling bonds can be secured.

When the number of excess Si atoms per 1 atom exceeds $5/12$, Si crystallization is likely to occur. As a result, a general problem of a floating gate memory occurs in that transverse conduction of the information charge is likely to occur in the floating gate and it becomes difficult to secure nonvolatility. For example, in the Si-rich nitride film $Si_UN$ (where, $U>0.75$), even heating at 700° C. does not cause crystallization if $U=100/18$ (H. P. Lobl et al., 1998, Thin Solid Films, vol. 317, pp. 153-156). In the Si process, there is an LPCVD process at about 700° C. as the long-time high-temperature process after forming the floating gate. When U is brought to be 100/18 or less, that is, the number of excess Si atoms per one atom $(U-0.75)/(U+1)$ is brought to be 0.73 or lower, crystallization does not occur event at 700° C. Consequently, it is possible to prevent degradation of charge retention characteristics caused by transverse conduction. Consequently, the upper limit (third upper limit) of the number of excess Si atoms per one atom is 0.73.

In $Si_Y(SiO_2)_X(Si_3N_4)_{1-X}M_Z$ (where, M is at least one element other than Si, O, and N; $0 \leq X \leq 1$; $Y>0$; $Z \geq 0$), too, bringing the number of excess Si atoms per one atom $Y/(Y+7-4X+Z)$ to be 0.73 or lower, crystallization at 700° C. can be suppressed and degradation of charge retention characteristics can be prevented.

In the case where the floating gate layer is 5 nm thick or less, even the amorphous Si formed only by Si atoms is not crystallized by 700° C. heat treatment (P. D. Persans et al., 1988, J. of Non-Crystalline Solids, Vol. 102, pp. 130-135). Consequently, it is possible to prevent degradation of charge retention characteristics caused by transverse conduction even when the number of excess Si atoms per one atom is greater than 0.73.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a semiconductor region having a source region, a drain region, and a channel region provided between the source region and the drain region;

a first tunnel insulation film formed on the channel region;

a barrier layer formed on the first tunnel insulation film and having an energy barrier;

a second tunnel insulation film formed on the barrier layer;

a charge storage portion formed on the second tunnel insulation film and comprising an insulation film expressed by $Si_Y(SiO_2)_X(Si_3N_4)_{1-X}M_Z$ (where, M denotes an element other than Si, O, and N, and $0 \leq X \leq 1$, $Y>0$, and $Z \geq 0$); and a control electrode formed on the charge storage portion and controlling a height of the energy barrier, wherein the X, Y and Z satisfy the following relationship:

$$[2 \times 2X/(4-2X)+(4-4X)/(4-2X)] \times [Y/(Y+7-4X+Z)] \geq 0.016.$$

2. The semiconductor device according to claim 1 wherein the X, Y and Z satisfy the following relationship:

$$[2 \times 2X/(4-2X)+(4-4X)/(4-2X)] \times [Y/(Y+7-4X+Z)] \geqq 0.037.$$

3. The semiconductor device according to claim 1, wherein the insulation film which forms the charge storage portion is a silicon oxinitride film expressed by $Si_Y(SiO_2)_X(Si_3N_4)_{1-X}$ (where, 0<X<1, Y>0).

4. The semiconductor device according to claim 1, wherein the insulation film which forms the charge storage portion is a silicon nitride film expressed by $Si_UN$ (where, U>0.75).

5. The semiconductor device according to claim 1, wherein the insulation film which forms the charge storage portion is a silicon oxide film expressed by $Si_VO$ (where, V>0.5).

6. The semiconductor device according to claim 5, wherein the V satisfies the following relationship:

$$2 \times (V-0.5)/(V+1) \geqq 0.016.$$

7. The semiconductor device according to claim 5, wherein the V satisfies the following relationship:

$$2 \times (V-0.5)/(V+1) 0.037.$$

8. The semiconductor device according to claim 1, wherein the X, Y, and Z satisfy the following relationship:

$$Y/(Y+7-4X+Z) \geqq 0.73.$$

9. The semiconductor device according to claim 1, wherein the X, Y, and Z satisfy the following relationship:

$$Y/(Y+7-4X+Z) \geqq 5/12.$$

10. The semiconductor device according to claim 1, wherein the X, Y, and Z satisfy the following relationship:

$$Y/(Y+7-4X+Z) \geqq 1/12.$$

11. The semiconductor device according to claim 1, wherein each of the first tunnel insulation film and the second tunnel insulation film is a silicon oxide film having a thickness of 0.8 nm or more and 3.0 nm or less.

12. The semiconductor device according to claim 1, wherein the charge storage portion has a thickness of 5 nm or less.

13. The semiconductor device according to claim 1, wherein the barrier layer is formed by a nano-particle layer containing a conductive nano-particle which satisfies a Coulomb blockade condition.

14. The semiconductor device according to claim 13, wherein the conductive nano-particle is a silicon nano-particle having a diameter of 0.4 nm or more and 15 nm or less.

15. The semiconductor device according to claim 13, wherein the density of conductive nano-particles contained in the nano-particle layer is $1 \times 10^{12}$ cm$^{-2}$ or more.

16. The semiconductor device according to claim 13, wherein the density of conductive nano-particles contained in the nano-particle layer is $2 \times 10^{12}$ cm$^{-2}$ or more.

17. The semiconductor device according to claim 1, wherein the barrier layer is formed by a layer which has traps.

18. The semiconductor device according to claim 1, wherein the barrier layer is formed by an insulation layer and energy at the bottom of a conduction band of the insulation layer is higher than that of the channel region.

19. A semiconductor device comprising:
- a semiconductor region having a source region, a drain region, and a channel region provided between the source region and the drain region;
- a first tunnel insulation film formed on the channel region;
- a barrier layer formed on the first tunnel insulation film and having an energy barrier;
- a second tunnel insulation film formed on the barrier layer;
- a charge storage portion formed on the second tunnel insulation film and comprising an insulation film formed of a silicon oxinitride film expressed by $Si_Y(SiO_2)X(Si_3N_4)_{1-X}$ (where, 0<X<1, Y>0);
- a control electrode formed on the charge storage portion and controlling a height of the energy barrier,
- wherein the X and Y satisfy the following relationship:

$$[2 \times 2X/(4-2X)+(4-4X)/(4-2X)] \times [Y/(Y+7-4X)] \geqq 0.016.$$

20. The semiconductor device according to claim 19, wherein the X and Y satisfy the following relationship:

$$[2 \times 2X/(4-2X)+(4-4X)/(4-2X)] \times [Y/(Y+7-4X)] \geqq 0.037.$$

21. A semiconductor device comprising:
- a semiconductor region having a source region, a drain region, and a channel region provided between the source region and the drain region;
- a first tunnel insulation film formed on the channel region;
- a barrier layer formed on the first tunnel insulation film and having an energy barrier;
- a second tunnel insulation film formed on the barrier layer;
- a charge storage portion formed on the second tunnel insulation film and comprising an insulation film formed of a silicon nitride film expressed by $Si_UN$ (where, U>0.75);
- a control electrode formed on the charge storage portion and controlling a height of the energy barrier,
- wherein the U satisfies the following relationship:

$$(U-0.75)/(U+1) \geqq 0.016.$$

22. The semiconductor device according to claim 21, wherein the U satisfies the following relationship:

$$(U-0.75)/(U+1) \geqq 0.037.$$

* * * * *